(12) United States Patent
Tago et al.

(10) Patent No.: US 9,777,883 B2
(45) Date of Patent: Oct. 3, 2017

(54) SUPERCONDUCTING MAGNET APPARATUS (71) Applicant: JAPAN SUPERCONDUCTER TECHNOLOGY INC., Hyogo (JP)

(72) Inventors: Kazuhito Tago, Kobe (JP); Yoshio Okui, Kobe (JP); Masatoshi Yoshikawa, Kobe (JP)

(73) Assignee: JAPAN SUPERCONDUCTOR TECHNOLOGY INC., Hyogo (JP)

( * ) Notice: Subject to any disclaimer, the term of this patent is extended or adjusted under 35 U.S.C. 154(b) by 6 days.

(21) Appl. No.: 14/770,373

(22) PCT Filed: Mar. 7, 2014

(86) PCT No.: PCT/JP2014/055965
§ 371 (c)(1),
(2) Date: Aug. 25, 2015

(87) PCT Pub. No.: WO2014/142027
PCT Pub. Date: Sep. 18, 2014

(65) Prior Publication Data
US 2016/0215921 A1 Jul. 28, 2016

(30) Foreign Application Priority Data
Mar. 14, 2013 (JP) .................. 2013-052038

(51) Int. Cl.
*F16M 11/04* (2006.01)
*H01F 6/00* (2006.01)
(Continued)

(52) U.S. Cl.
CPC ............. *F16M 11/04* (2013.01); *F16M 11/22* (2013.01); *G01R 33/3802* (2013.01); *H01F 6/00* (2013.01); *G01R 33/3815* (2013.01)

(58) Field of Classification Search
CPC G01R 33/3802; G01R 33/3815; F16M 11/22; F16M 11/04; H01F 6/00; H01F 6/04
See application file for complete search history.

(56) References Cited

U.S. PATENT DOCUMENTS 5,726,512 A * 3/1998 Chu .................... F16C 32/0438
310/90.5
7,276,907 B2 * 10/2007 Kitagawa ........... G01R 33/3806
248/633
(Continued)

FOREIGN PATENT DOCUMENTS

CN 201673752 U 12/2010
JP H05-243042 A 9/1993
(Continued)

OTHER PUBLICATIONS

International Search Report and Written Opinion of the International Searching Authority, PCT/JP2014/055965, dated Apr. 8, 2014.
(Continued)

*Primary Examiner* — Bernard Rojas
(74) *Attorney, Agent, or Firm* — Studebaker & Brackett PC (57) ABSTRACT

The present invention is such that a main body neither drops out nor is destroyed. A plurality of brackets (4), provided on a side surface of a main body (2) in which a superconducting magnet is mounted internally in a state in which each protrudes therefrom, are each supported by a stand (3) from the bottom, and enclosing members (5) are attached to the side surface of the main body (2) with a prescribed space (a) opened from the bottom of the brackets (4). At least part of the inside surface of an enclosing member (5) surrounds a stand (3) in a non-contact state.

3 Claims, 6 Drawing Sheets (51) Int. Cl.
 *G01R 33/38* (2006.01)
 *F16M 11/22* (2006.01)
 *G01R 33/3815* (2006.01)

(56) References Cited

U.S. PATENT DOCUMENTS

| | | | |
|---|---|---|---|
| 7,474,099 B2* | 1/2009 | Boesel | F25D 19/006 |
| | | | 324/309 |
| 8,896,312 B2* | 11/2014 | Stauffenegger | G01R 33/3403 |
| | | | 324/321 |
| 2008/0246567 A1 | 10/2008 | Isogami et al. | |
| 2016/0270690 A1* | 9/2016 | Saitoh | A61B 5/0555 |

FOREIGN PATENT DOCUMENTS

| JP | H06-249981 A | 9/1994 |
|---|---|---|
| JP | 2002-167947 A | 6/2002 |
| JP | 2008-192848 A | 8/2008 |

OTHER PUBLICATIONS

The extended European search report issued by the European Patent Office dated Oct. 27, 2016, which corresponds to European Patent Application No. 14764124.5-1568 and is related to U.S. Appl. No. 14/770,373.

"Varian Liquid State Probes"; NMR; Nov. 5, 2003; pp. 1-12. Internet Article: URL:http://www.ibrarian.net/navon/paper/Liquid_State_Probes_Probes_for_Every_Application_.pdf?paperid=282770 [Retrieved on Oct. 14, 2016].

"AVANCE (TM) III HD NMR—Experience Science in High-Definition"; Bruker; Jun. 1, 2012; pp. 1-4. Internet Article: URL:https://www.bruker.com/fileadmin/user_upload/8-PDF-Docs/MagneticResonance/NMR/brochures/AVANCE_III_HD.pdf [Retrieved on Oct. 14, 2016].

* cited by examiner

SUPERCONDUCTING MAGNET APPARATUS

TECHNICAL FIELD

The present invention relates to a superconducting magnet apparatus applied to an NMR (Nuclear Magnetic Resonance) system.

BACKGROUND ART

PTL 1 describes a superconducting magnet apparatus applied to an NMR system. The main body of the superconducting magnet apparatus including a superconducting magnet is supported from underneath by three stands.

Figure 7:
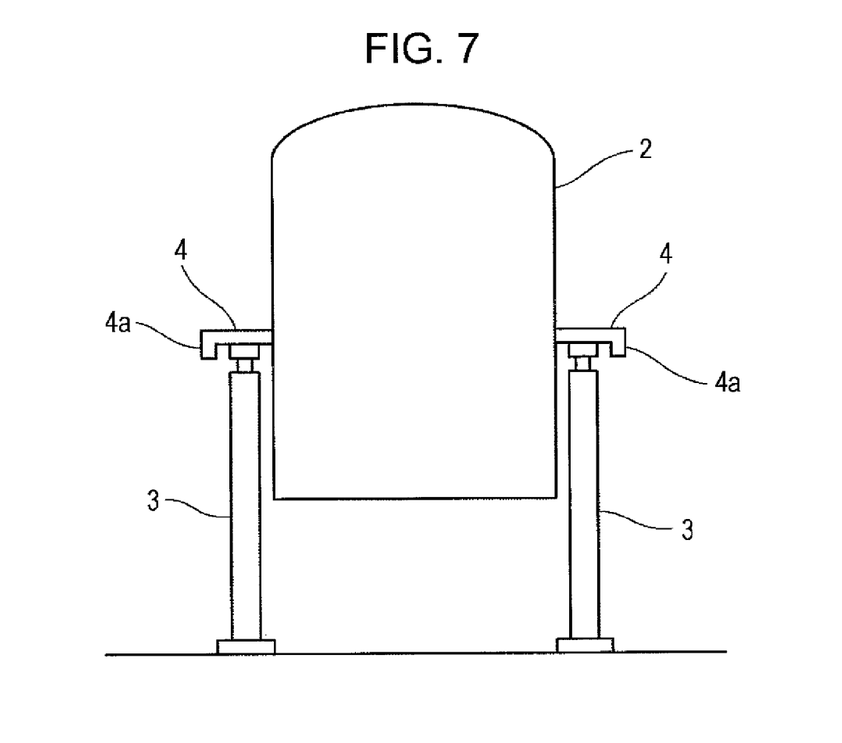
FIG. 7 is a side view of a superconducting magnet apparatus.

In addition, as illustrated in FIG. 7, a main body 2 is supported by three stands 3 (one not illustrated). The three stands 3 support, from underneath, three brackets 4 (one not illustrated) that protrude from a side surface of the main body 2 at different locations in the circumferential direction of the side surface of the main body 2. In addition, to regulate the positional relationship between the main body 2 and the stands 3 in the horizontal direction, a rim 4a that extends downward is provided on the tip of each of the brackets 4 so that the bracket 4 does not come off from the stand 3 or the stand 3 is bolted on the bracket 4.

CITATION LIST

Patent Literature

PTL 1: Japanese Unexamined Patent Application Publication No. 5-243042

SUMMARY OF INVENTION

Technical Problem

However, even when a rim is provided on the tip of the bracket, the main body bounces and moves in the horizontal direction if strong vibration, such as earthquake, occurs. Thus, the rim of the bracket rides over the stand. Accordingly, the main body comes off from the stand. In addition, even when the stand is bolted on the bracket, the stand itself may fall over if strong vibration, such as earthquake, occurs, and, thus, the main body falls off and is damaged.

Accordingly, an object of the present invention is to provide a superconducting magnet apparatus capable of preventing fall-off and damage of the main body thereof.

Solution to Problem

The present invention provides a superconducting magnet apparatus including a main body having a superconducting magnet therein, a plurality of brackets disposed on a side surface of the main body at different locations in a circumference direction of the side surface of the main body so as to protrude from the side surface, a leg provided for each of the brackets, where the leg supports the bracket from beneath so that a space is formed under the main body, and a surrounding member provided for each of the bracket, where the surrounding member is attached to one of the side surface of the main body or a bottom surface of the bracket so that at least part of an inner surface of the surrounding member surrounds the periphery of the leg in a non-contact state. The surrounding member is disposed so as to include a position at a predetermined distance below the bracket.

Advantageous Effects of Invention

According to the present invention, by surrounding the periphery of the leg using at least part of the inner surface of the surrounding member in a non-contact state, the moving range of the main body relative to the leg is regulated. In addition, by providing a predetermined distance between the surrounding member and the bracket, the leg does not come off from the surrounding member even when strong vibration, such as earthquake, occurs and, thus, the main body bounces on the stands. Accordingly, even when strong vibration, such as earthquake, occurs and, thus, the main body bounces on the stands and moves in the horizontal direction, the bracket does not come off from the bracket. In addition, even when the leg is tilted due to strong vibration, such as earthquake, the tilt angle of the leg is regulated so as to be within the margin of safety, since the leg that is tilted is brought into contact with the inner surface of the surrounding member. Consequently, even when the strong vibration, such as earthquake, occurs and the stand is tilted, the stand is not tilted at such an angle that the main body falls down. In this manner, falling-off and damage of the main body can be prevented.

DESCRIPTION OF EMBODIMENTS

Exemplary embodiments of the present invention are described below with reference to the accompanying drawings.

First Embodiment (Configuration of Superconducting Magnet Apparatus)

Figure 1:
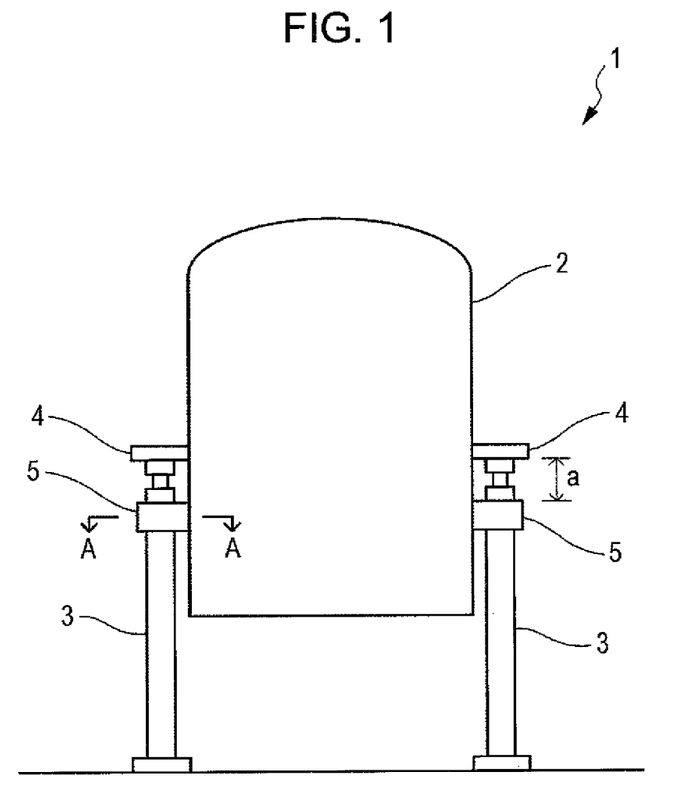
FIG. 1 is a side view of a superconducting magnet apparatus.

According to a first embodiment of the present invention, as illustrated in FIG. 1, a superconducting magnet apparatus 1 includes a main body 2 having a superconducting magnet disposed therein, three brackets 4 (one not illustrated) each protruding from a side surface of the main body 2, three stands (legs) 3 each supporting one of the three brackets 4 from beneath (one not illustrated), and three surrounding members 5 attached to the side surface of the main body 2 (one not illustrated).

The main body 2 is cylindrical in shape. In the central portion of the main body 2, a space that extends in the vertical direction and that allows sample probe (not illustrated) to be inserted thereinto from beneath is formed.

The three brackets 4 are disposed so as to protrude from the side surface of the main body 2 at different locations in the circumferential direction of the main body 2 and, more specifically, at intervals of 120°. Note that the number of the brackets 4 is not limited to three.

The stand 3 is provided for each of the brackets 4. The stand 3 supports the bracket 4 from beneath so that a space is formed under the main body 2. In this manner, the main body 2 is supported by the stands 3 via the brackets 4. In addition, the stands 3 are formed from, for example, air dampers that have a vibration isolation function and, thus, prevent vibration from being transferred from the outside to the superconducting magnet in the main body 2. The lower end of each of the stands 3 is bolted on a floor. Note that the number of the stands 3 is not limited to three if the number of the stands 3 is the same as that of the brackets 4.

In addition, the surrounding member 5 is provided on each of the brackets 4. The surrounding member 5 is attached to the side surface of the main body 2 at predetermined distance of "a" below the bracket 4. Note that the number of the surrounding members 5 is not limited to three if the number of the surrounding members 5 is the same as that of the brackets 4.

Figure 2:
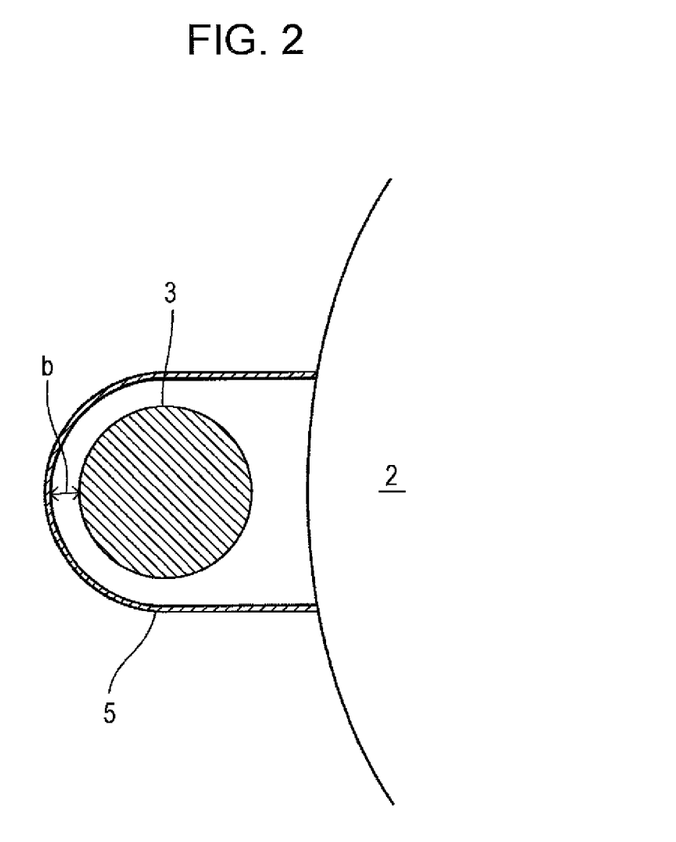
FIG. 2 is a cross-sectional view taken along a line A-A of FIG. 1.

As illustrated in FIG. 2, which is a cross-sectional view taken along a line A-A of FIG. 1, the surrounding member 5 has a U-shape in cross section. Part of the inner surface of the surrounding member 5 surrounds the periphery of the stand 3 in a non-contact state. In this manner, by inhibiting the surrounding member 5 from contacting with the stand 3, the surrounding member 5 does not impair the vibration isolation function of the stand 3. In addition, vibration that is transferred via the stand 3 is not further transferred to the main body 2 via the surrounding member 5. According to the present embodiment, the smallest distance b between the stand 3 and the surrounding member 5 is 10 mm.

Referring back to FIG. 1, the predetermined distance a, which is the distance between the bracket 4 and the surrounding member 5, is set so that even when the main body 2 bounces on the stand 3 due to strong vibration, such as earthquake, the stand 3 does not come off from the surrounding member 5. According to the present embodiment, the predetermined distance a is set to a value greater than or equal to 40 mm.

Figure 3:
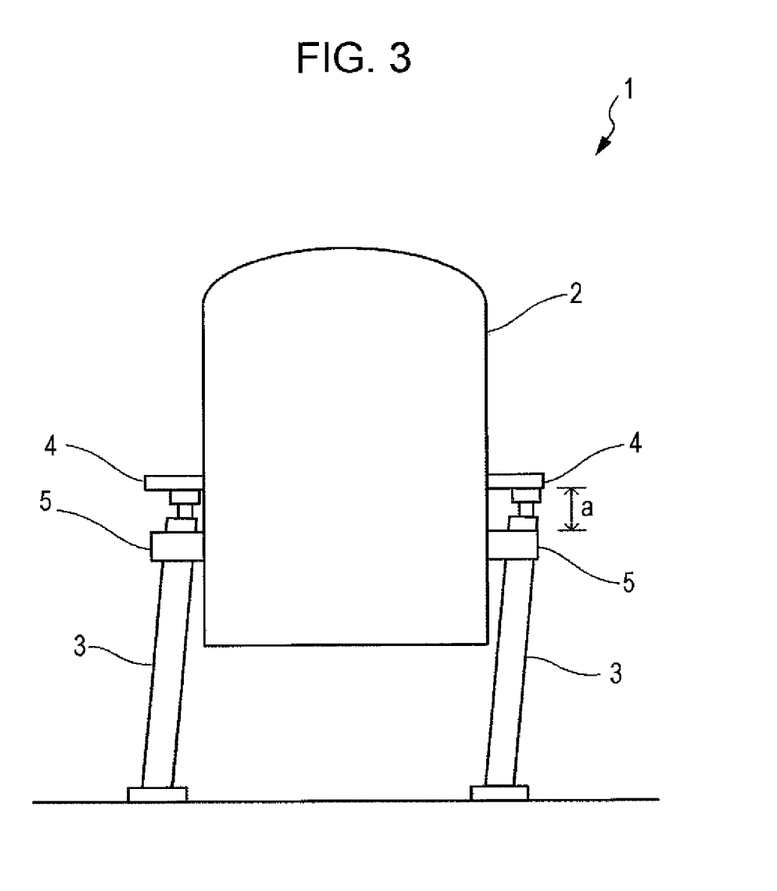
FIG. 3 is a side view of a superconducting magnet apparatus.

In addition, as illustrated in FIG. 3, if the stand 3 is tilted due to strong vibration, such as earthquake, the stand 3 that is tilted is brought into contact with the inner surface of the surrounding member 5. Thus, the tilt angle of the stand 3 is regulated so as to be within a margin of safety.

In addition, the surrounding member 5 is removable from the main body 2. When the superconducting magnet apparatus 1 is assembled, the brackets 4 are placed on the three stands 3 accurately positioned relative to one another. After the main body 2 is supported in this manner, the surrounding members 5 are attached to the side surface of the main body 2 by, for example, bolts. By attaching the surrounding members 5 to the side surface of the main body 2 after the main body 2 is supported by the stands 3 in this manner, the stands 3 need not be inserted into the inside of the surrounding members 5 when the brackets 4 are placed on the stands 3 from above the stands 3. Accordingly, the assembling operation is facilitated. In addition, when the superconducting magnet apparatus 1 is disassembled, the surrounding members 5 are removed from the side surface of the main body 2 before the main body 2 is hoisted from the three stands 3 using, for example, a crane. Since the surrounding members 5 are removed from the side surface of the main body 2 before the main body 2 is hoisted from the stands 3 in this manner, each of the surrounding members 5 does not hit the stand 3 when the main body 2 is hoisted. Accordingly, the disassembling operation is facilitated.

According to such a configuration, even when strong vibration, such as earthquake, occurs and, thus, the main body 2 bounces on the stands 3 and moves in the horizontal direction, the moving range of the main body 2 relative to the stands 3 is limited, since part of the inner surface of the surrounding member 5 surrounds the stand 3 in a non-contact state. In addition, the surrounding member 5 is disposed below the bracket 4 at such a predetermined distance a from the bracket 4 that the stand 3 does not come off from the surrounding member 5. Accordingly, the stand 3 does not come off from the surrounding member 5. Since the bracket 4 does not come off from the stand 3, the main body 2 does not fall down.

In addition, as illustrated in FIG. 3, even when strong vibration, such as earthquake, occurs and, thus, the stand 3 is tilted, the tilt angle of the stand 3 can be regulated so as to be within a margin of safety, since the stand 3 that is tilted is brought into contact with the inner surface of the surrounding member 5. Since the stand 3 is not tilted at such an angle that the main body 2 falls down, the main body 2 does not fall down.

In addition, the state of the stands 3 can be observed through a gap between the bracket 4 and the surrounding member 5. Accordingly, if the stands 3 is, for example, an air damper, the operating state of the stand 3 can be examined at a maintenance time.

Note that the shape of the cross-section of the surrounding member 5 is not limited to a U-shape. For example, the shape may be circular. In such a case, an additional member that connects the surrounding member 5 having a cylindrical shape to the main body 2 having a cylindrical shape may be provided. Alternatively, the surrounding member 5 may be integrated with the main body 2. Since the entire inner surface of the surrounding member 5 having a cylindrical shape surrounds the periphery of the stand 3 in a non-contact state, the moving range of the main body 2 relative to the stands 3 is more narrowly regulated. In addition, the stand 3 that is tilted is in suitable contact with the inner surface of the surrounding members 5.

(Effect)

As described above, according to the superconducting magnet apparatus 1 of the present embodiment, since at least part of the inner surface of the surrounding member 5 surrounds the periphery of the stand 3 in a non-contact state, the moving range of the main body 2 relative to the stand 3 is regulated. In addition, the surrounding member 5 and the bracket 4 are disposed at a predetermined distance a from each other. In this manner, even when the main body 2 bounces on the stands 3 due to strong vibration, such as earthquake, the stands 3 do not come off from the surrounding members 5. Accordingly, even when strong vibration, such as earthquake, occurs and the main body 2 bounces on the stands 3 and moves in the horizontal direction, the brackets 4 do not come off from the stands 3. In addition, even when the stand 3 is tilted due to strong vibration, such as earthquake, the stand 3 that is tilted is brought into contact with the inner surface of the surrounding member 5. Thus, the tilt angle of the stand 3 is regulated so as to be within a margin of safety. Consequently, even when the strong vibration, such as earthquake, occurs and the stand 3 is tilted, the stand 3 is not tilted at such an angle that the main body 2 falls down. In this manner, falling-off and damage of the main body 2 can be prevented.

Second Embodiment (Configuration of Superconducting Magnet Apparatus)

A superconducting magnet apparatus 201 according to a second embodiment of the present invention is described below. Unlike the superconducting magnet apparatus 1 according to the first embodiment, as illustrated in FIG. 4, the superconducting magnet apparatus 201 according to the present embodiment includes a surrounding member 205 having a cylindrical shape instead of the surrounding members 5 having a U-shaped cross section.

The surrounding member 205 is provided for each of the brackets 4. In addition, the surrounding member 205 is connected to the lower surface of the bracket 4. The surrounding member 205 has a predetermined length c in the vertical direction so as to include a position at a predetermined distance below the bracket 4.

Figure 4:
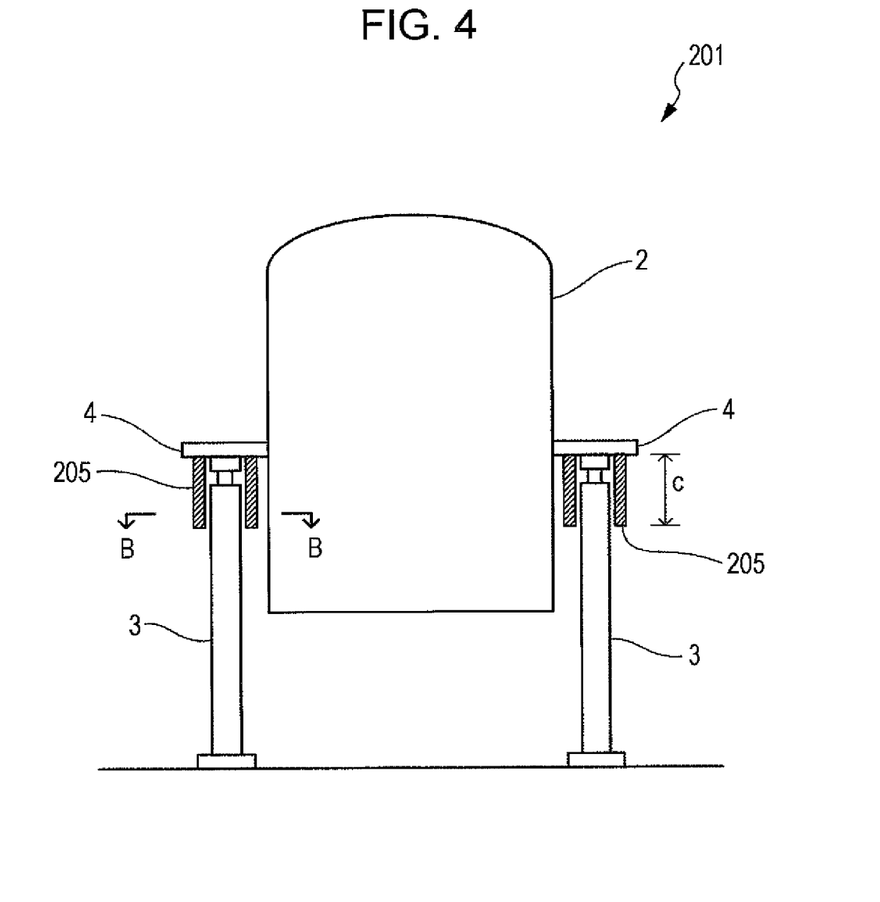
FIG. 4 is a side view of a superconducting magnet apparatus.
Figure 5:
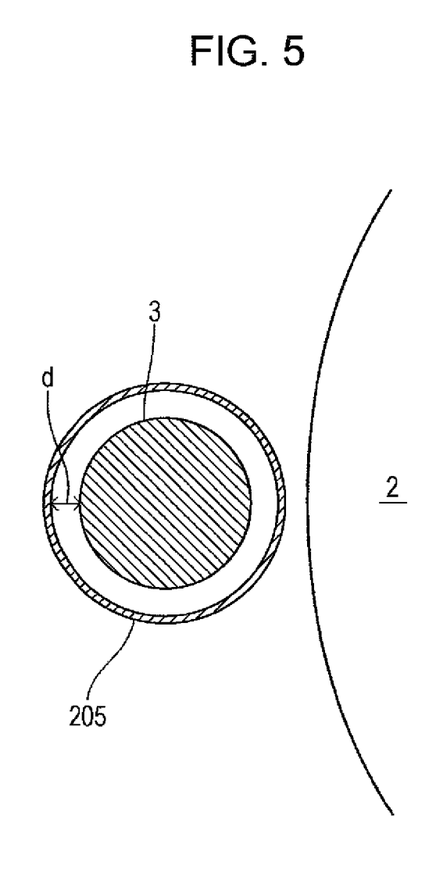
FIG. 5 is a cross-sectional view taken along a line B-B of FIG. 4.

As illustrated in FIG. 5, which is a cross-sectional view taken along a line B-B of FIG. 4, the surrounding member 205 is circular in cross section. The inner surface of the surrounding member 205 surrounds the periphery of the stand 3 in a non-contact state. In this manner, by inhibiting the surrounding member 205 from contacting with the stand 3, the surrounding member 205 does not impair the vibration isolation function of the stand 3. In addition, vibration that is transferred via the stand 3 is not further transferred to the main body 2 via the surrounding member 205. According to the present embodiment, a distance d between the stand 3 and the surrounding member 205 is 10 mm.

Referring back to FIG. 4, a predetermined length c is set to a length so that even when the main body 2 bounces on the stand 3 due to strong vibration, such as earthquake, the stand 3 does not come off from the surrounding member 205. According to the present embodiment, the predetermined length c is set to a value greater than or equal to 40 mm.

Figure 6:
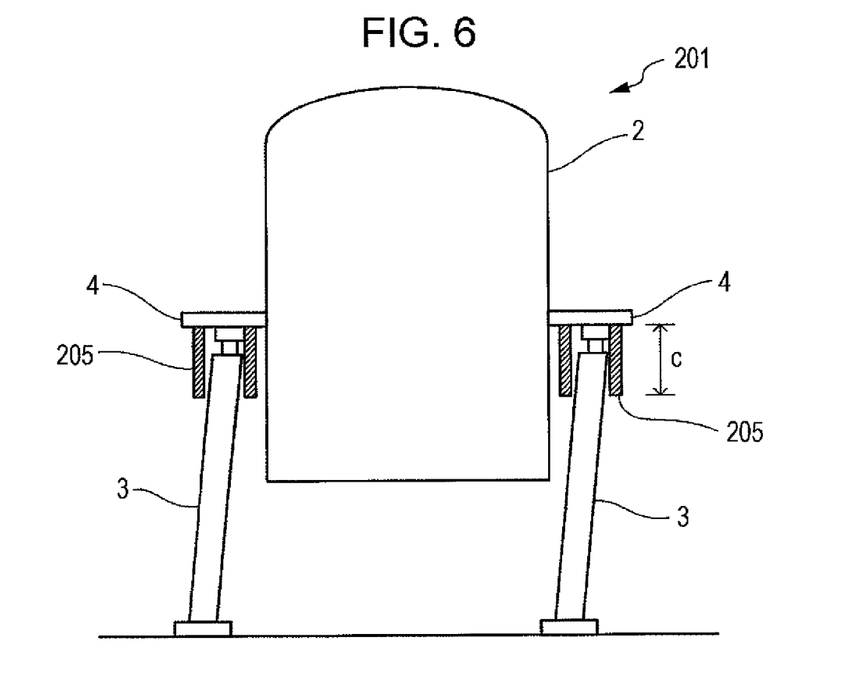
FIG. 6 is a side view of a superconducting magnet apparatus.

In addition, as illustrated in FIG. 6, if the stand 3 is tilted due to strong vibration, such as earthquake, the tilted stand 3 is brought into contact with the inner surface of the surrounding member 205. Thus, the tilt angle of the stand 3 is regulated so as to be within a margin of safety.

According to such a configuration, even when strong vibration, such as earthquake, occurs and, thus, the main body 2 bounces on the stands 3 and moves in the horizontal direction, the moving range of the main body 2 relative to the stands 3 is limited, since the inner surface of the surrounding member 205 surrounds the periphery of the stand 3 in a non-contact state. In addition, the surrounding member 205 has a predetermined length c that prevents the stand 3 from coming off from the surrounding member 205 in the vertical direction. Accordingly, the stand 3 does not come off from the surrounding member 205. Since the bracket 4 does not come off from the stand 3, the main body 2 does not fall down.

In addition, as illustrated in FIG. 6, even when strong vibration, such as earthquake, occurs and, thus, the stand 3 is tilted, the tilt angle of the stand 3 is regulated so as to be within a margin of safety, since the stand 3 that is tilted is brought into contact with the inner surface of the surrounding member 205. Since the stand 3 is not tilted at such an angle that the main body 2 falls down, the main body 2 does not fall down.

(Effect)

As described above, according to the superconducting magnet apparatus 201 of the present embodiment, since the inner surface of the surrounding member 205 surrounds the periphery of the stand 3 in a non-contact state, the moving range of the main body 2 relative to the stand 3 is regulated. In addition, the surrounding member 205 has a predetermined length c in the vertical direction. In this manner, even when the main body 2 bounces on the stands 3 due to strong vibration, such as earthquake, the stand 3 does not come off from the surrounding member 205. Accordingly, even when strong vibration, such as earthquake, occurs and the main body 2 bounces on the stands 3 and moves in the horizontal direction, the brackets 4 do not come off from the stands 3. In addition, even when the stand 3 is tilted due to strong vibration, such as earthquake, the stand 3 that is tilted is brought into contact with the inner surface of the surrounding member 205. Thus, the tilt angle of the stand 3 is regulated so as to be within a margin of safety. Consequently, even when the strong vibration, such as earthquake, occurs and the stand 3 is tilted, the stand 3 is not tilted at such an angle that the main body 2 falls down. In this manner, falling-off and damage of the main body 2 can be prevented.

It should be noted that the above-described embodiments of the present invention are merely for illustrative purposes only and are not meant to be limiting on the scope of the present invention. The designs of the particular configurations can be modified as appropriate. In addition, the operations and effects described in the embodiments of the present invention are only exemplary operations and effects attainable by the present invention. The operations and effects of the present invention are not limited to those described in the embodiments of the present invention.

REFERENCE SIGNS LIST 1, 201 superconducting magnet apparatus
2 main body
3 stand (leg)
4 bracket
5, 205 surrounding member

The invention claimed is:

1. A superconducting magnet apparatus comprising:
a main body having a superconducting magnet therein;
a plurality of brackets disposed on a side surface of the main body at different locations in a circumference direction of the side surface of the main body so as to protrude from the side surface;
a leg provided for each of the brackets, the leg supporting the bracket from beneath so that a space is formed under the main body; and
a surrounding member provided for each of the bracket, the surrounding member being attached to one of the side surface of the main body or a bottom surface of the bracket, at least part of an inner surface of the surrounding member surrounding the periphery of the leg in a non-contact state,
wherein the surrounding member is disposed so as to include a position at a predetermined distance below the bracket.

2. The superconducting magnet apparatus according to claim 1, wherein each of the surrounding members is attached to the side surface of the main body at predetermined distance below the bracket, and at least part of the inner surface surrounds the periphery of the leg in a non-contact state.

3. The superconducting magnet apparatus according to claim 1, wherein the surrounding member is cylindrical in shape, and wherein the surrounding member is connected to a lower surface of the bracket and has a predetermined length in a vertical direction, and the inner surface of the surrounding member surrounds the periphery of the leg in a non-contact state.

* * * * *